United States Patent [19]
Hollinger

[11] Patent Number: 5,089,434
[45] Date of Patent: Feb. 18, 1992

[54] MASK SURROGATE SEMICONDUCTOR PROCESS EMPLOYING DOPANT-OPAQUE REGION

[75] Inventor: Theodore G. Hollinger, Redmond, Oreg.

[73] Assignee: Advanced Power Technology, Inc., Bend, Oreg.

[21] Appl. No.: 467,947

[22] Filed: Jan. 22, 1990

Related U.S. Application Data

[60] Division of Ser. No. 194,874, May 17, 1988, Pat. No. 4,895,810, which is a continuation-in-part of Ser. No. 842,771, Mar. 21, 1986, Pat. No. 4,748,103.

[51] Int. Cl.$^5$ .................................... H01L 21/335
[52] U.S. Cl. ......................... 437/41; 437/29; 437/40; 437/203; 437/228; 437/245; 437/249
[58] Field of Search ............. 437/29, 31, 40, 41, 437/228, 233, 235; 357/23.4

[56] References Cited

U.S. PATENT DOCUMENTS

| | | | |
|---|---|---|---|
| 4,419,811 | 12/1983 | Rice | 437/29 |
| 4,459,605 | 7/1984 | Rice | 357/22 |
| 4,466,176 | 8/1984 | Temple | 437/29 |
| 4,503,598 | 5/1985 | Vora et al. | 437/29 |
| 4,516,143 | 5/1985 | Love | 357/55 |
| 4,895,810 | 1/1990 | Meyer et al. | 437/225 |

Primary Examiner—Brian E. Hearn
Assistant Examiner—Tom Thomas
Attorney, Agent, or Firm—Marger, Johnson, McCollom & Stolowitz

[57] ABSTRACT

A dopant-opaque layer of polysilicon is deposited on gate oxide on the upper substrate surface to serve as a pattern definer during fabrication of the device. It provides control over successive P and N doping steps used to create the necessary operative junctions within a silicon substrate and the conductive structure formed atop the substrate. A trench is formed in the upper silicon surface and a source conductive layer is deposited to electrically contact the source region as a gate conductive layer is deposited atop the gate oxide layer. The trench sidewall is profile tailored using a novel $O_2$-$SF_6$ plasma etch technique. An oxide sidewall spacer is formed on the sides of the pattern definer and gate oxide structures, before depositing the conductive material. A planarizing layer is applied and used as a mask for selectively removing any conductive material deposited atop the oxide spacer. The polysilicon layer on the oxide is reduced in thickness during trenching so that any conductive material deposited atop the spacers protrude upward for easy removal of excess, conductive material. The sidewall spacers can be sized, either alone or in combination with profile tailoring of the trench, to control source-region width (i.e., parasitic pinched base width) and proximity of the source conductor to the FET channel. Electrical contact between the source conductive layer and the source regions is enhanced by forming a low-resistivity layer between them.

14 Claims, 9 Drawing Sheets

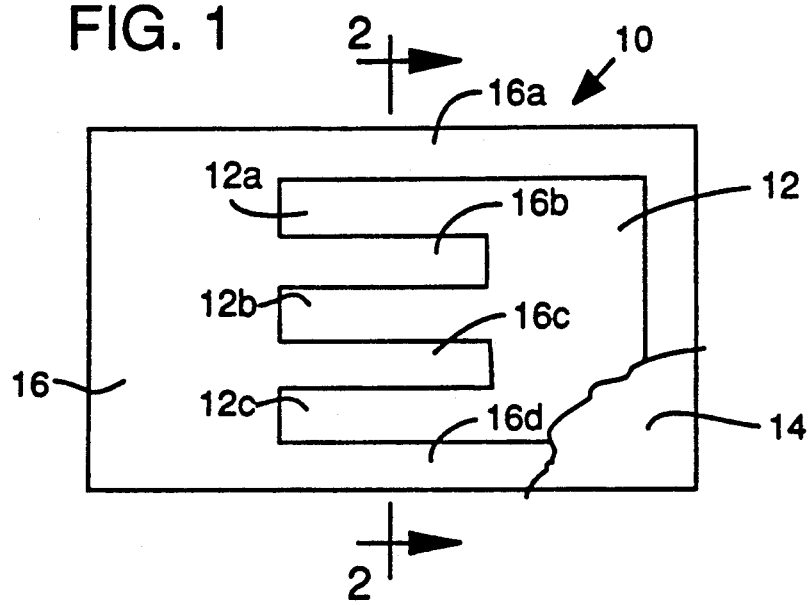
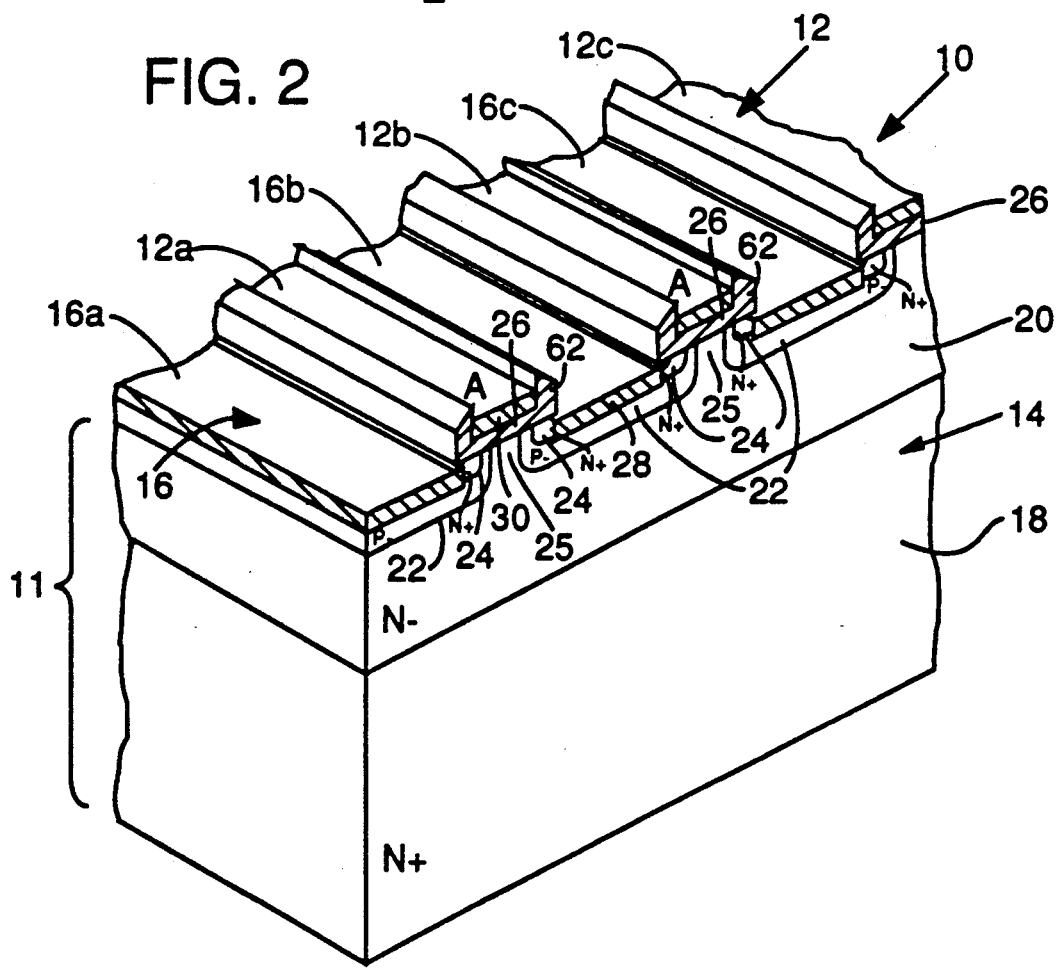

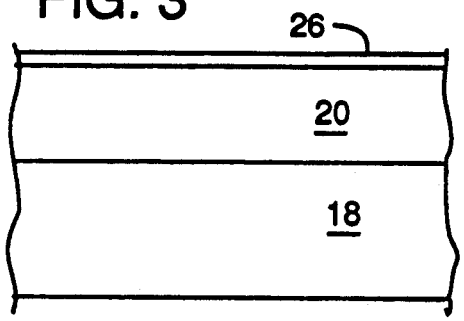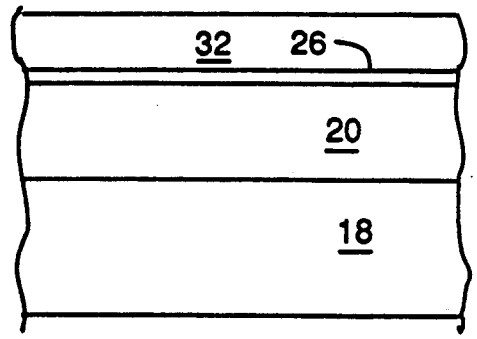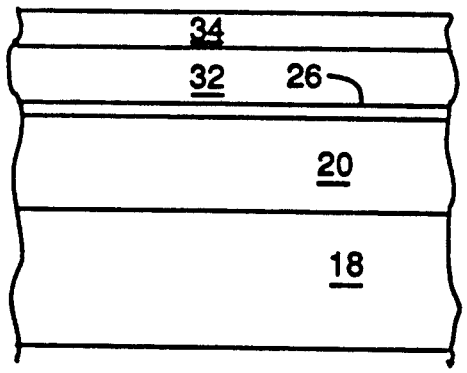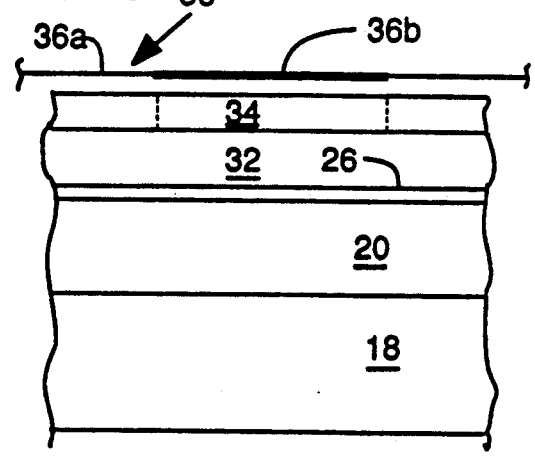

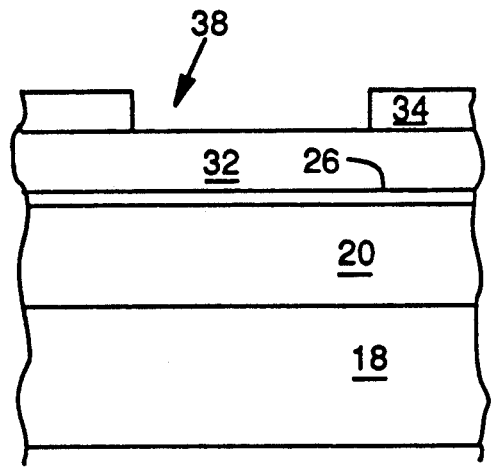
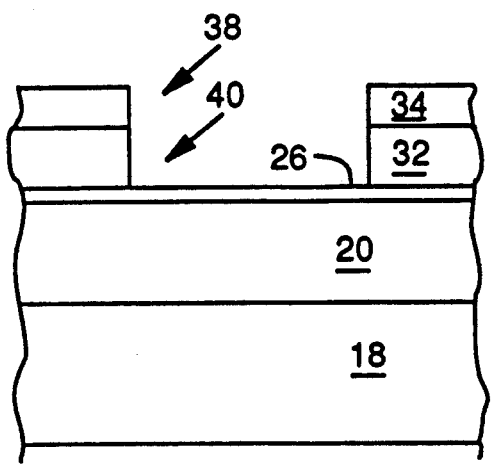
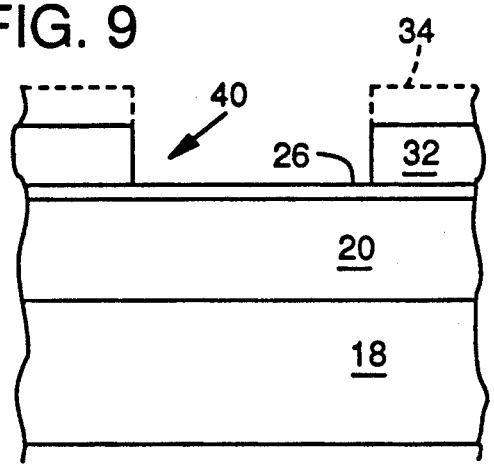
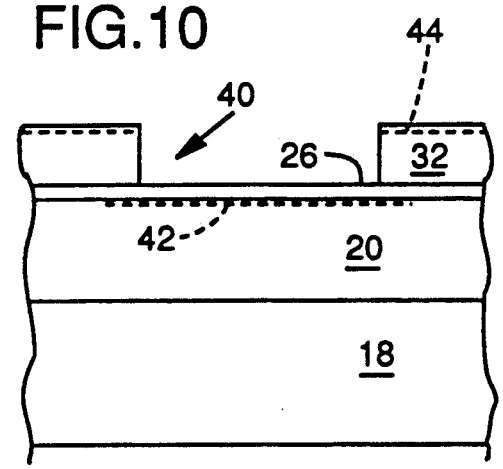
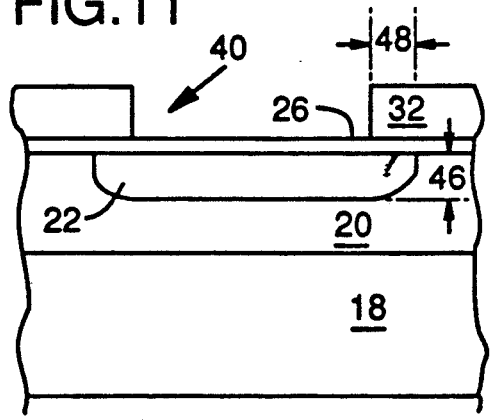
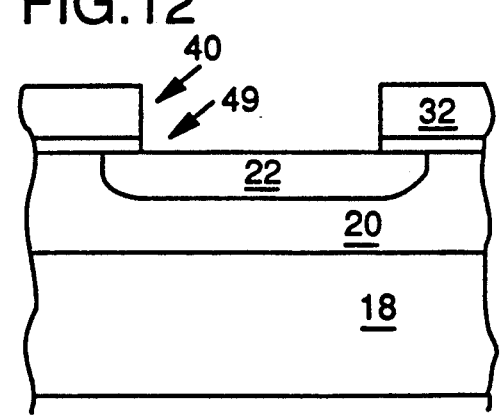

MASK SURROGATE SEMICONDUCTOR PROCESS EMPLOYING DOPANT-OPAQUE REGION

RELATED APPLICATION DATA

This is a division of application Ser. No. 07/194,874, filed May 17, 1988, now U.S. Pat. No. 4,895,810, issued Jan. 23, 1990, and is a continuation-in-part of commonly-assigned U.S. patent application of T. G. Hollinger, Ser. No. 06/842,771, filed Mar. 21, 1986, entitled MASK SURROGATE SEMICONDUCTOR PROCESS EMPLOYING DOPANT-OPAQUE REGION, now U.S. Pat. No. 4,748,103, issued May 31, 1988.

BACKGROUND OF THE INVENTION

This invention relates to a method for producing power semiconductor devices, and more particularly, to such a power MOSFET fabrication process and structure which substantially eliminates the incidence of fatal defects in a power device as a consequence of defects in, and/or misalignment between, the layers used in the production of such devices.

In the prior art fabrication of transistor devices on silicon wafers, such as power-MOS field-effect transistors, there have been significant problems in (1) obtaining an acceptably high yield of relatively large-current-capability transistors without (2) driving the cost of production to extremely high and unacceptable levels. A major contributor to this problem has been that the best known prior art fabrication techniques for making power MOSFET devices typically employ five or more independent masking, diffusion and metallization steps, each offering a significant opportunity for the creation of a fatal error in a device. Generally speaking, the more steps, the greater the likelihood of fatal defects; or conversely, the lower the yield of devices that operate within specifications. In high-current/high voltage power devices, it is especially important to avoid designs and defects that can lead to current leakage, shorting, high on-resistance or a wide variation in performance characteristics among nominally similar devices.

One cause of these defects is misalignment occurring during successive masking steps. Defects can also occur in situations where one or more of the masks or layers may, individually, have localized defects. Also, fatal defects can occur if airborne contaminants collect on a mask or a wafer. This possibility is also aggravated by the plurality of masking steps now required.

Gate and source contacts have been conventionally separated using masking or multiple layer techniques. These steps require critical alignment and/or an intermetallic dielectric such as oxide, PSG, BPSG, BSG, or other material such as polyimide. This approach, though effective and traditional, is complex and lends itself to excessive yield loss and cumbersome processing techniques. Also, the device structures that result from these techniques have a tendency to increase certain undesirable parasitic effects.

These problems make it difficult economically, with any expectation of achieving an acceptably high yield, to manufacture relatively large, high-current-capability devices. Put another way, the larger the design of the device, the greater is the likelihood that it will contain a fatal defect. To date, an economically practical size limit has been about 0.25 inches on each side of a device. Accordingly, the tendency in the past has been to reduce the size of individual devices to increase the chances of a larger number of smaller devices surviving defects. However, these smaller devices, while emerging with an acceptable yield percentage, are capable only of handling relatively low-level currents, and thus low-power applications. Accordingly, they must be linked electrically in collections in some fashion in order to be able to handle relatively high-power applications.

Past efforts to improve the yield of larger-surface-area devices have primarily directed attention to performing the manufacturing steps in the cleanest possible environment, creating masks under extremely expensive manufacturing conditions, and improving mask alignment by use of very sophisticated, precise alignment machines. These areas of attention are extremely expensive, and, as a practical matter, make their use economically unattractive vis-a-vis the final market price which, as a consequence, must be attached to a finished device.

Accordingly, a need remains for a device structure and fabrication process that can produce high voltage solid-state power switches with increased yields in larger size to handle high current but without undesirable parasitic effects.

SUMMARY OF THE INVENTION

A general object of the present invention, therefore, is to provide a novel manufacturing procedure which is capable of reducing substantially the percentage likelihood that a fatal defect will occur in a final semiconductor device, even though that device may occupy the entire usable area (i.e., as a single device) on a substrate, such as a silicon wafer.

A related object is to provide such a procedure which offers a simple and very low-cost process enabling the production of high-yield, defect-free semiconductor devices which are capable individually of handling strikingly larger currents than are now practical.

Another object is to provide a power MOSFET structure and process with effective yet simple gate-to-source contact isolation.

An additional object is to improve power MOSFET device characteristics.

The key to the simplicity, effectiveness and cost advantage of the invention is that, according to one manner of practicing it, only a single, independent mask is required in the production of the usual plural, functional regions in a semiconductor device. According to another way of practicing the invention, no mask at all is required. A dopant-opaque region or layer, such as polysilicon on gate oxide on the upper surface of the substrate, serves as a pattern definer during fabrication of the device and ultimately disappears. The invention thereby offers excellent and simply-effected control over both the doping steps used to create the necessary operative junctions within a silicon substrate and the conductive structures formed atop the substrate. This aspect of the invention is advantageously enhanced by spacing the source and gate conductive layers vertically apart at a boundary defined by the pattern definer. This is done, preferably, by forming a trench in which a source conductive layer is deposited in electrical contact with a doped source region of the substrate at the same time that a gate conductive layer is deposited atop a gate oxide layer. The trench is formed in an exposed portion of the upper surface of the substrate bounded by the pattern definer and gate oxide. In one embodiment, the trench sidewall is profile tailored to produce an overhang of the gate oxide which further enhances separation of the source and gate conductive layers.

Separation of gate and source conductive layers can be further assured by forming an oxide spacer on the sides of the pattern definer and gate oxide structures, depositing the conductive material, applying a planarizing layer and selectively removing any conductive material deposited atop the oxide spacer. The polysilicon layer is reduced in thickness so that the spacers, and any conductive material deposited atop them, protrude upward for easy removal of excess, conductive material. This reduction can be done advantageously in combination with the aforementioned trenching procedure.

The sidewall spacers can be sized, either alone or in combination with profile tailoring of the trench, to control source-region width (i.e., parasitic pinched base width) and proximity of the source conductor to the FET Channel, which affects source resistance. The transistor body and source regions are preferably formed by doping the exposed silicon to different depths with opposite dopant-type diffusions prior to forming the trench. The depth of the trench is gauged to separate the shallower, second doped region into two source regions located along opposite sidewalls of the trench. This sequence has two advantages. First, the location and spacings of the PN junctions are subject only to two variables, that is the diffusions themselves, and not to a third variable of the trenching procedure. This enables tight control of $V_{th}$ Second, most defects introduced in the semiconductor surface material due to ion implantation or gaseous diffusion on the dopants are removed by subsequent trenching, thus reducing leakage current, due to downward propagation of the defects in a subsequent diffusion. A third diffusion of the same dopant type as the first diffusion can be co-diffused into the substrate after forming the trench to limit the downward extent of diffusion of the source regions and increase parasitic bipolar base conductivity below the source metallization and the source regions. This improves reverse-bias avalanche characteristics of the device.

Electrical contact between the source conductive layer and the source regions, which can be spaced apart by either the spacers or by recessed trench sidewalls, is enhanced by forming a low-resistivity layer between them. This can be done either by dopant diffusion, selective deposition of metal such as tungsten, or silicide formation in the exposed silicon in the trench.

The foregoing and additional objects, features, and advantages of the present invention will be more readily apparent from the following detailed description of a preferred embodiment which proceeds with reference to the accompanying drawings.

BRIEF DESCRIPTION OF THE DRAWINGS

FIG. 1 is a simplified plan view, with a small portion broken away, illustrating a power MOS field-effect transistor (semiconductor device) manufactured in accordance with the steps of the present invention.

FIG. 2 is an enlarged, fragmentary, perspective view illustrating a section of the device of FIG. 1 taken generally along the line 2—2 in FIG. 1.

FIGS. 3–13D and 14–16D, inclusive, are enlarged, fragmentary views, taken generally in the area bracketed by the letters A—A in FIG. 2, illustrating successive steps according to one manner of practicing the invention.

DETAILED DESCRIPTION OF THE INVENTION

Figure 13:
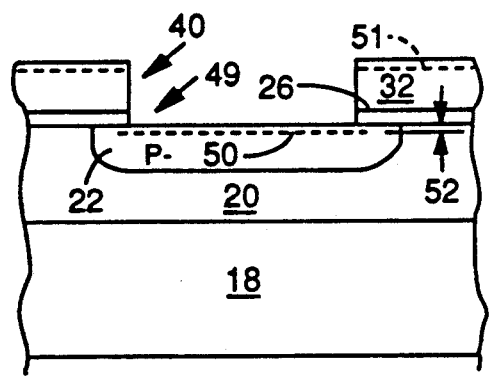

Turning now to the drawings, and directing attention first of all to FIGS. 1 and 2, indicated generally at 10 is an N-channel, power-MOS field-effect transistor (semiconductor device) which has been manufactured on a silicon substrate 11 according to the present invention. Transistor 10 is like prior art devices in that it includes a gate 12, a drain 14 and a source structure 16. The gate and source structure are formed on an upper, or reference, surface of the substrate, the drain is formed in the bulk of the substrate. In the particular transistor embodiment shown in these two figures, gate 12 includes three "fingers" 12a, 12b, 12c, arranged in an open topography. Similarly, the source structure includes four fingers 16a, 16b, 16c, 16d between and surrounding the fingers of gate 12.

In the description which now immediately follows, certain dimensions are given. These dimensions are specific to a transistor designed to act as a 500-volt switch.

Looking particularly at FIG. 2 for a moment, one can clearly see the various layers and functional regions which make up transistor 10. More specifically, in substrate 11 there is a base N+ doped layer 18, and an N− doped epitaxial layer 20, which collectively form drain 14. A P- doped region 22 underlying each of fingers 16a–16d forms the so called "body" in the transistor, and residing therein is an N+ doped region 24 which forms the source in the transistor extending continuously along a side of each of fingers 16a–16d adjacent the gate fingers 12a–12c. A region 25 of the N-substrate extends to the substrate surface beneath the gate fingers 12a–12c and provides a drain conduction path in between regions 24.

Immediately above the regions 22, 24, at the upper surface of the substrate, are a gate-oxide layer (SiO$_2$) 26 also referred to as a MOS outer layer, and two metallization layers 28, 30. These two metal layers are typically formed, and herein are formed, of aluminum, although other material such as tungsten may also be used. Layer 28 acts as an electrical contact for the source extending along the sides thereof adjacent, and layer 30 forms previously mentioned gate 12. In operation, when transistor 10 is switched on, current flows from the source regions 24 to drain regions 25 via an inversion layer, or N-type channel, formed in a near-surface portion of the normally P-type regions 22 subjacent the gate fingers 12a–12c as a result of an electric field induced by biasing gate 12.

With attention now drawn to FIGS. 3–16, inclusive, let us consider how transistor 10 was formed in accordance with one manner of practicing the invention.

Layers 18, 20 are provided in the usual commercially available silicon wafer, and may be thought of herein as forming the "starting material" for the manufacture of transistor 10. Layers 18, 20, make up what is referred to herein as a substrate structure 11. In the particular structure now being described, layer 18 has a thickness of about 15-mils and a resistivity of about 0.007–0.02 ohm-centimeters. Epitaxial layer 20 has a thickness herein of about 36–44 microns, and a resistivity of about 14–22 ohm-centimeters. Gate-oxide layer 26 has typical thickness herein of about 2400 Angstroms but can vary in a range of 1000–2500 Angstroms. The oxide layer conventionally thermally grown as an initial processing procedure through oxidation in a diffusion furnace at a temperature of around 1000° C.-1100° C. Layer 26 is referred to as an oxide layer.

FIG. 4 illustrates the preparation of a new layer 32 which overlies layer 26. Layer 32 herein is a dopant-opaque protective layer, preferably formed of polysilicon by conventional chemical vapor deposition with a thickness in a range of roughly 7000–27,000 Angstroms and preferably 20,000 Angstroms. This layer, which ultimately disappears in this embodiment but not in another, as will be explained, plays a significant role both in avoiding multiple masking steps, and in controlling proper doping to create the desired junctions. There are several considerations which relate to the selection of the material to be used for layer 32. More specifically, the material in this layer must be etchable in a medium which is different from that in which layer 26 is etchable. Further, layer 32 must be capable of withstanding (i.e., retaining structural integrity) the high temperatures which characterize conventional diffusion steps. Finally, layer 32 must be impenetrable (100% non-penetration) by the implantation of doping substances which are used to form previously mentioned regions 22, 24. Materials other than polysilicon that may be used for this layer include silicon nitride, refractory-metal silicide, and doped oxides.

A negative photoresist layer 34 is next formed over layer 32 (see FIG. 5) by any conventional pinhole-free technique. A positive photoresist could also be used to form this layer.

According to the manner of practicing the invention now being described, only a single masking step, involving a single, independent mask, is required. This is a key factor minimizing the likelihood that any fatal patterning defect will occur during subsequent processing steps. Put another way, and as will become apparent, any such defect that could occur in subsequent steps will result, with very few exceptions, from the existence of an internal defect in the mask used per se. If such a defect turns up, a new defect-free mask can easily be prepared.

So, turning to FIG. 6, the single, independent mask which is employed herein during the photolithography steps is shown generally at 36. As will be understood by those skilled in the art, the pattern which will ultimately result in transistor 10 is suitably created in mask 36, and in FIG. 6, mask 36 can be seen to include light-transparent areas, such as area 36a, and light-opaque areas, such as area 36b.

The assembly illustrated in FIG. 6 is exposed to light during a typical photolithography step, and as a consequence, the photoresist layer 34 ends up with regions exposed (outside the dashed lines) and regions not exposed (inside the dashed lines) to light.

FIG. 7 illustrates the next step, wherein photoresist layer 34, and specifically those regions which have not been exposed to light, is removed conventionally by a suitable photoresist developer. Such a removed or exposed region is shown generally at 38.

FIG. 8 illustrates the next subsequent step, wherein the polysilicon layer is now etched, by any commercial etching technique, to transfer the image previously created in photoresist layer 34 into layer 32. Accordingly, a matching image for exposed region 38 is created in layer 32, and such is indicated generally as a region at 40. Region 40 is referred to herein as a mask-surrogate pattern-definer, and more specifically as a first mask-surrogate-pattern-definer. This term is used to point out an important operational feature of the invention, namely that through the creation of such a pattern-definer in the structure itself, one completely eliminates the need for the use of any independent mask other than mask 36 to fabricate transistor 10. This is an important contribution to the creation of a device free from masking-related defects, in that such a defect can no longer develop in the structure through the subsequent processing steps.

The pattern-definer thus formed has a defined outline characteristic (edge configuration). As will become apparent in the description which continues, this outline per se is used as the only necessary selfalignment masking agency in manufacturing steps that follow.

Photoresist layer 34 is now removed by any convenient conventional technique, and this is illustrated in FIG. 9. The process next proceeds into what are referred to generally herein as doping steps.

FIG. 10 illustrates a first implant step, which takes the form of a boron implant that will result, as will be explained, in previously mentioned doped region 22. The boron implant step is performed in a conventional implanter at an energy level of about 60–160-KEV to produce an implant density in layer 20 of typically $5 \times 10^{13}$ to $2 \times 10^{14}$-atoms-per-square-centimeter. Dashed line 42 illustrates peak gradient density of dopant implanted into layer 20 by this step, and this implant extends to a depth of about 0.27–0.5 microns. As can be seen, dashed line 42 shows that the implant extends laterally a short distance beyond the boundaries of pattern-definer 40. This results from the action of the gate-oxide layer which functions as a dispersion medium.

A dashed line shown at 44 illustrates that there is similar penetration of boron into polysilicon layer 32, but not a complete penetration of this layer because of its thickness. This effective opacity of layer 32 to boron penetration functions, importantly, to achieve properly controlled doping in this step.

While boron has been described herein as the first implant substance, other P— type dopants that could be used to perform the same function include bismuth and aluminum.

FIG. 11 illustrates a first diffusion step, which is performed in a conventional diffusion furnace at a typical temperature of about 1150° C. for about 3–8 hours. Here, as can be seen, what results is a diffusion of implant 44 to form the beginning of previously described P— region 22. Typically, this diffused region has a depth, shown at 46 in FIG. 11, of about 3–6 microns. This region extends laterally beyond the margins of pattern-definer 40 by a dimension, shown generally at 48, which is about 60–80% of dimension 46.

FIG. 12 illustrates the next step in the procedure, wherein gate oxide layer 26 is etched by any suitable commercial etching technique to transfer into layer 26 a matching pattern (image of first pattern-definer 40). Thus, there results an opening 49 in layer 26 which matches (in outline) region 40, which can be referred to as a second mask-surrogate pattern-definer. As discussed below, this step may be omitted under certain conditions.

FIG. 13 illustrates a second implant step which is performed herein using phosphorus. This step, as was true of the first implant step, takes place in a conventional implanter at an energy level of about 40 to 160-KEV to produce a final implant density of typically $1 \times 10^{15}$ to $1 \times 10^{16}$-atoms-per-square-centimeter. The peak density of the implant which results in region 20 is indicated by dashed line 50, and this implant extends to a depth, indicated at 52, of about 0.2 microns. It should be noted that, as is indicated by dashed line 50, the implant just performed is contained completely within P-type diffused region 22, and extends laterally slightly beyond the boundaries of pattern-definer 40. The upper dashed line 51 indicates slight penetration of phosphorus into layer 32, nowhere complete penetration. Thus, here too, dopant protection layer 32 functions significantly, as mentioned in connection with the boron doping implant step, to control and effect a proper final doped result.

As one skilled in the art will appreciate, alternative procedures may be concocted to effect the introduction of phosphorus into silicon without the creation of the second mask surrogate pattern definer, such as by increasing the implant energy to penetrate layer 26 without first etching it away. Nonetheless, the first described procedure involving the forming of opening 49 is preferred.

While phosphorus has been used specifically herein to perform this implant, other N-type materials that could be used include arsenic and antimony. One such alternative is discussed below with reference to FIGS. 18-20A.

In a later step (See FIG. 14), the phosphorus implant is diffused to form what will ultimately become the N+ type source regions 24. First, however, several steps are performed to topologically define what will ultimately form the source and gate contact structures and isolation thereof. These steps are shown in FIGS 13A-13D, as next described.

Figure 13A:
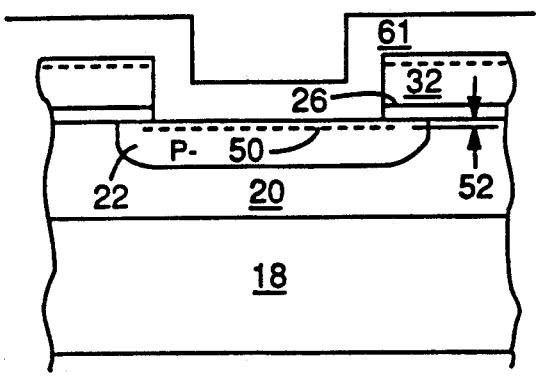

FIG. 13A illustrates layer 61 deposited on top of layers 32, 26 and 22. Layer 61 can be, but is not restricted to, chemical-vapor-deposited silicon dioxide (preferred), silicon nitride, or oxynitride. This layer may also be thermally grown $SiO_2$, or include an initial thin thermal oxide layer. A wide range of thicknesses can be used for layer 61. For the discussion to follow, a thickness of 1,000 Angstroms to 1 um can be used. An alternative approach, shown in FIGS. 18-20A, uses a thinner sidewall 61a, e.g., 1000-2000 Angstroms.

Figure 13B:
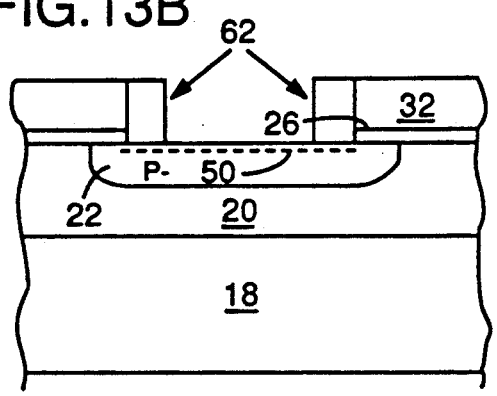

In FIG. 13B, layer 61 has been anisotropically etched by a commercially-available method, such as reactive ion etch, to expose the silicon substrate surface while leaving a substantial amount of layer 61, shown as sidewalls 62, on the vertical side of layers 32 and 26. Sidewalls 62 will later protect marginal portions of the implant 50 from removal in later steps. Sidewalls 62 will also enhance the isolation of the aforementioned gate 12 and source 16 in later steps and so may be referred to alternatively as spacers 62.

Figure 13C:
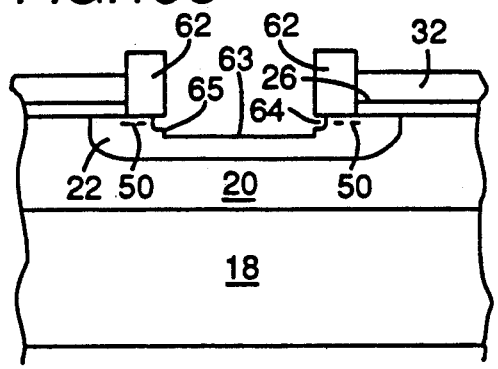

FIG. 13C illustrates that the exposed silicon substrate is etched between areas 62 by a profile controlled method to form a recess or trench 63. The depth of this etch is controlled so that the trench extends down and through implant 50. The preferred stairstep profile of trench 63, with an overhang 64, is shown in FIG. 13C. (Alternative profiles obtainable by variation of the profile controlled method are shown in FIGS. 13E-13L and described below.) This overhang enhances the separation of contacts 12 and 16. This preferred embodiment is achieved by etching on a parallel plate plasma reactor which is bottom powered, such as a TEGAL 701 or LAM 790. The profile is preferably produced by a novel multiple step processing method. In the case of the preferred, stairstep embodiment, an isotropic etch of 26-75 sccm (standard cubic centimeters per minute) Sulfur hexafluoride and 20-56 sccm Helium at 0.7-1.1 Torr and 100-250 watts is used to create the overhang 64 with a vertical-to-lateral etching selectivity of less than 3:1. A second anisotropic step is then performed, adding oxygen at 5.0 to 15.0 sccm, at the same power and pressure to continue the trench deeper and with substantially vertical sides 65 aligned with respect to the spacers 62. This etch is preferably performed with a selectivity of more than 10:1. Layer 32 is reduced in thickness during this operation, however, it is not essential that layer 32 be reduced in thickness.

Figure 13D:
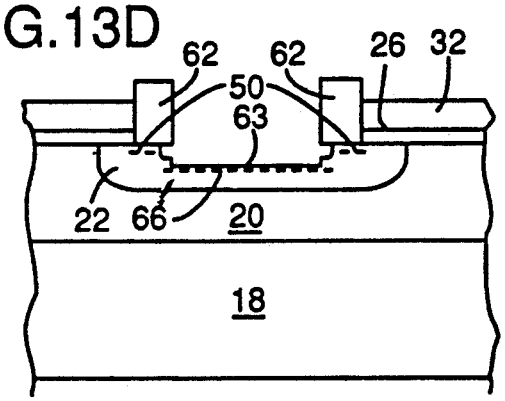

FIG. 13D illustrates a second implant of boron (or similar P-type dopant) to form implanted region 66 at a concentration of $5 \times E14$ to $2 \times E16$ ions/$cm^2$ at 30K to 160 KeV to a depth of 0.1 to 0.4 microns in the bottom of trench portion 63. The implant scatters along the margins of region 66 under the trench sidewalls 65. P-type region 66 has the purpose of limiting the depth of diffusion of N-type implant 50 during subsequent diffusion steps, resulting in substantially decreased parasitic bipolar transistor gain as discussed in the context of FIG. 14.

Figure 13E:
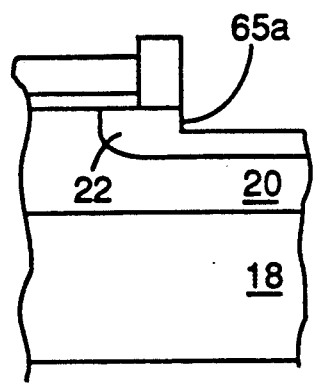
FIGS. 13E–13L show alternative examples of the multiple step processing method shown in FIG. 13C.
Figure 13F:
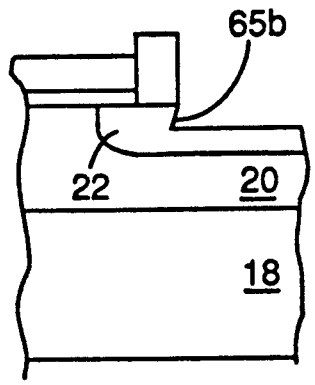
Figure 13G:
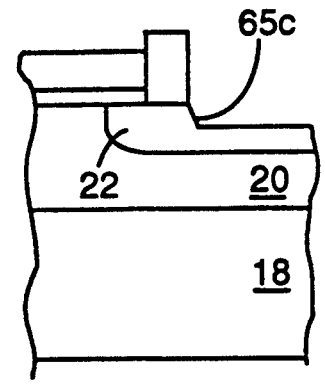
Figure 13H:
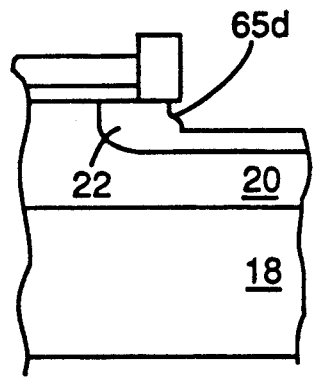
Figure 13I:
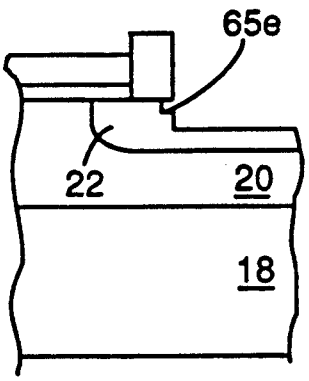
Figure 13J:
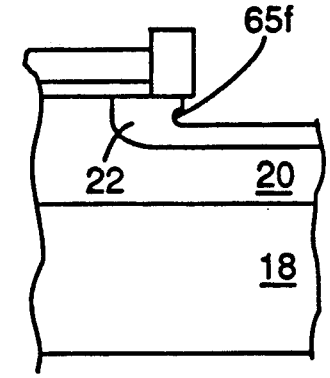
Figure 13K:
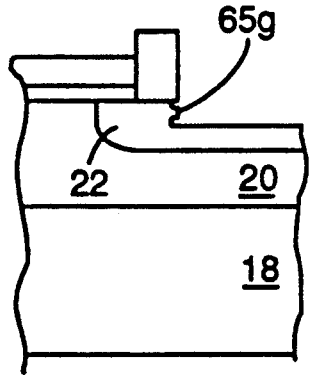
Figure 13L:
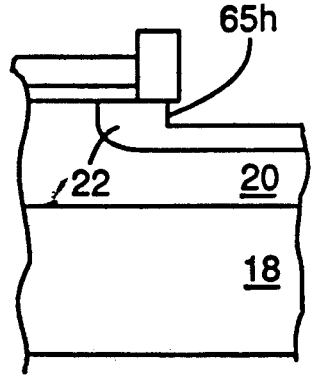

FIGS. 13E and 13L show various alternative profiles of trench 63 obtainable with the above described multiple step, processing by changing the step sequence and varying the gas flows relative to those discussed in connection with FIG. 13C.

In Table 1, the first column shows the range of ratios of sidewall-passivatinq/etching gas that are used in producing the various profiles. The second column shows the selectivity ratio produced by each ratio in the first column, under the temperature and pressure conditions described above for the trenching step of FIG. 13C.

TABLE 1

| $O_2/SF_6$ Ratio | Vertical/Lateral Etch Rate |
|---|---|
| <.05 | 2.3:1 |
| .1 | 2.8:1 |
| .2 | 4.1:1 |
| .3 | 5.5:1 |
| .4 | 7.1:1 |
| .5 | 9.5:1 |
| .6 | 12.0:1 |
| .7 | 20.0:1 |

FIG. 13E shows a substantially vertical-sidewall 65a in a trench etched entirely as mentioned in connection with the etching of the lower portion of trench 63 in FIG. 13C. FIG. 13F shows a sidewall 65b that is undercut at an angle as a result of progressively reducing the oxygen ratio (e.g., from 0.3 to 0.05) during the etch of FIG 13E, gradually shifting from anisotropic to isotropic etching. FIG. 13G shows a sidewall 65c that is inclined inward as a result of increasing the oxygen ratio of the FIG. 13E etch, e.g., from 0.3 to 0.7. FIG. 13H illustrates a variation of the preferred profile (FIG. 13C), with a sidewall 65d that is first undercut and then inclined inward by isotropic etching for a set period followed by increasing the oxygen ratio gradually as in FIG. 13G. FIG. 13I shows a stairstep sidewall 65e resulting from a two-etch anisotropic etch which would have an oxide etch done isotropically between plasma trench etching. FIG. 13J illustrates a combination vertical-undercut sidewall 65f produced by an anisotropic etch followed by a reduced oxygen ratio etch. FIG. 13K illustrates a sidewall 65g produced by three step etch. This is a trench etched as the preferred embodiment (FIG. 13C) followed by a substantially reduced oxygen ratio etch. FIG. 13L illustrates a recessed, vertical sidewall 65h that results from the reversal of the etch steps of the preferred embodiment (i.e., anisotropic etch followed by the isotropic etch). All of the foregoing variations of trench profile can be obtained regardless of silicon crystal orientation.

Figure 14:
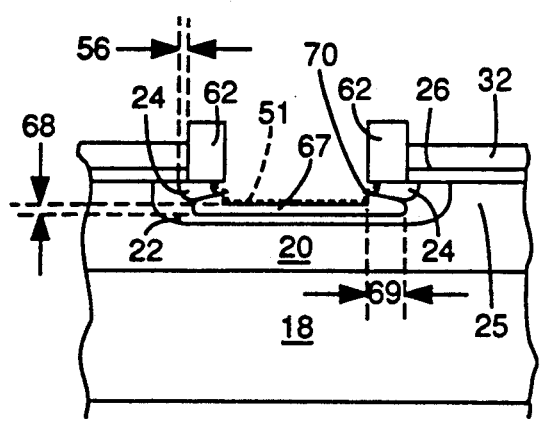

FIG. 14 illustrates the second and final diffusion step which is conducted to create transistor 10. This diffusion also takes place in a diffusion furnace, typically at a temperature of 1000° C.–1100° C. for about 1–10 hours. What results, completely within the region indicated at 22, is the completion of the diffusion of implant 50 which will result in previously-described N-type source region 24 and an increased P-type concentration of region 22 shown as area 67. Region 24 has a lateral-extension dimension, shown at 56, (extension beyond the boundaries of pattern-definer 40).

Implant 66 has diffused to form region 67. Region 67 has a depth dimension, shown at 68, of 1–4 microns and a lateral-extension dimension, shown at 69, of about 60–85% of dimension 68. Reference numeral 70 shows the limitation of diffusion depth of N-type region 24 by the interaction of the diffusion of P-type region 67. Co-diffusion of implants 50 and 66 result in this interaction. Separate diffusions can be performed or partial diffusion of implant 50 followed by implantation of implant 66 and a final diffusion can also be done.

Diffused region 67 limits the diffusion depth of implant 50, as it diffuses to form source region 24. It also increases the dopant concentration in region 22, thus increasing the device's capability to withstand substantially greater current during reverse bias conditions than a device without this implant. This increased reverse bias current, commonly encountered during avalanche-energy testing or inductive load switching, is a direct result of the decreased bipolar transistor gain due to use of the presently-disclosed procedure to form the parasitic NPN bipolar transistor formed by N-type region 24, P-type regions 22, 67 and N-type layer 20. This decreased gain is caused by an increased P-type base width between N-type regions 20 and 24 and increased base doping due to diffusion 67.

If an oxidizing diffusing cycle is used, then, as a consequence of this second diffusion step, a thin oxide film 51 (shown in dashed line) is grown on the exposed silicon surface of layer 20 within trench 63. At this point in the procedure, this oxide is easily removed by any suitable conventional oxide etching technique.

Figure 14A:
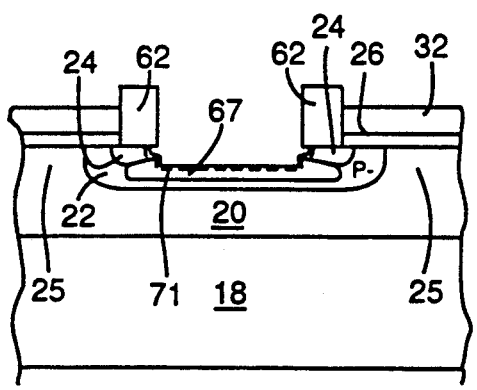

FIG. 14A illustrates the optional but preferred introduction of phosphorus region 71 to the exposed silicon surface of regions 24 and 67 to enhance contact to region 24. Introduction of dopant region 71 may be done by a number of conventional methods known to one skilled in the art. This doping step preferably is performed in a diffusion furnace, typically at a temperature of 750° to 1150° C. for 10 to 120 minutes. The source of this phosphorus may be from solid, liquid, or gaseous source or, depending on sidewall profile, may also be implanted. Other dopants such as arsenic or antimony may be substituted for phosphorus. This step is controlled to produce a shallow-diffusion ohmic contact, for example, a concentration of more than $10^{20}$ ions/cm$^3$ and a depth of about 0.5 $\mu$m.

Figure 15:
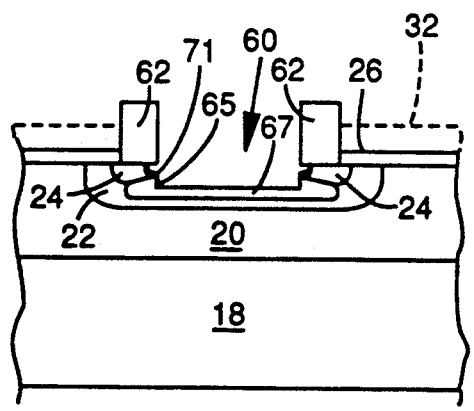

FIG. 15 illustrates a subsequent step in which silicon in the upper portion of layer 20 within trench 63 is further etched to produce the deepened trench shown generally at 60. The etch just referred to is performed anisotropically using the latter portion of the plasma trench process used in FIG. 13C.

It is important that the etch be controlled to assure that the depth of trench 60 extends completely through the N-type diffused contact region 71, but only partially through the diffused P-type region 67. It is also important that the etching thus performed creates a sufficiently upright wall 65 in trench 60 to positively assure electrical separation, during a later processing step, of the conductive layers 28, 30.

FIG. 15 also demonstrates yet another consequence of the trench etch—namely, the complete or near-complete removal of polysilicon layer 32. This leads to the transistor 10 eventually having either a metal gate or silicon gate, respectively, separated from the trench laterally by spacers 62 as well as vertically by the trench.

Figure 16:
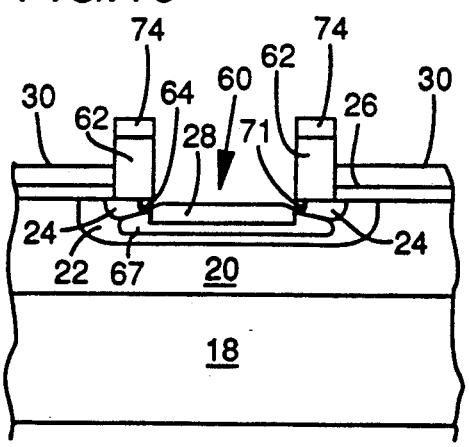

FIG. 16 illustrates the first step in the metallization, or conductive-material deposition, procedure of the invention. In this step, a conductive material, such as aluminum, is deposited to create source contact layer 28 and gate contact layer 30. This step is preferably conducted by a line-of-sight deposition technique, such as cold evaporation or sputtering, so that the conductive material forms layer 28 in electrical isolation from contact layer 30, but in contact with source region 24 either directly or through source contact region 71.

The profile-tailored trench etch, described above with reference to FIG. 13C, in conjunction with line-of-sight deposition of the conductive layers, helps to assure both electrical separation of layers 28, 30 and contact between layer 30 and source region 24. Overhang 64 tends to shield a portion of the exposed silicon trench sidewall immediately under the spacers and thereby enhances separation from conductive layer 30. At the same time, diffusion 71 assures electrical contact between conductive layer 28 and source region 24.

The foregoing step could also be carried out by the deposition of a refractory metal such as tungsten or metal-silicide, by selective vapor deposition or electroplating, with appropriate measures to assure isolation, as next described.

Whatever deposition technique is used will tend to produce a conductive artifact 74 atop sidewalls 62. This artifact can extend downward along the sidewalls, possibly connecting layers 28, 30, and so should be removed. FIGS. 16A–16D illustrate a technique that enhances the isolation of layers 28 and 30 shown in FIG. 16. This technique makes it possible initially to apply continuous conductive films that may initially connect layers 28 and 30 and then separate them electrically.

Figure 16A:
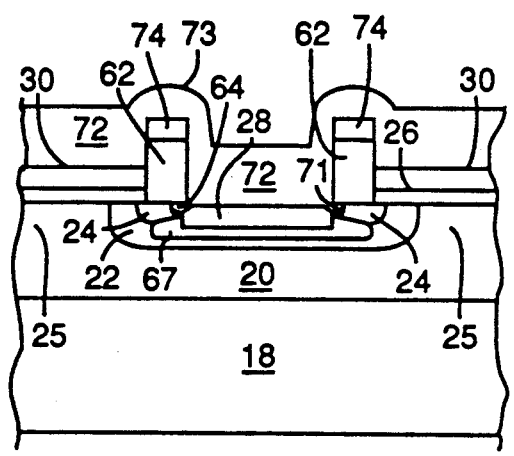

FIG. 16A illustrates the application of a layer 72 on top of areas 30 and 28. This layer may be a resin such as photoresist or any number of other compounds such as polyimide or spin-on glass. Layer 72 is applied so that it tends to planarize the surface such that the region 73 over artifact 72 is substantially thinner than the areas over 28 or 30. This layer may be applied using spin, spray, or roll-on techniques familiar to one skilled in the art to give the preferred coating.

Figure 16B:
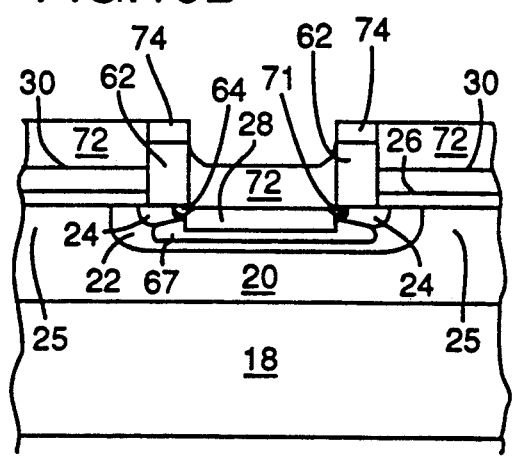

FIG. 16B illustrates the appearance of layer 72 after its thickness has been substantially reduced to expose artifact 74. This reduction can be done by conventional techniques familiar to one skilled in the art, such as plasma etching, ion milling, reactive ion etching, or wet chemical etching. The underlying layers 28 and 30 remain covered and thus unetched. This step is unique due to the fact that pattern delineation of surrogate pattern 40 as modified by spacer 62 is reproduced topographically without conventional methods of lithography or is substantially "self-aligning."

Figure 16C:
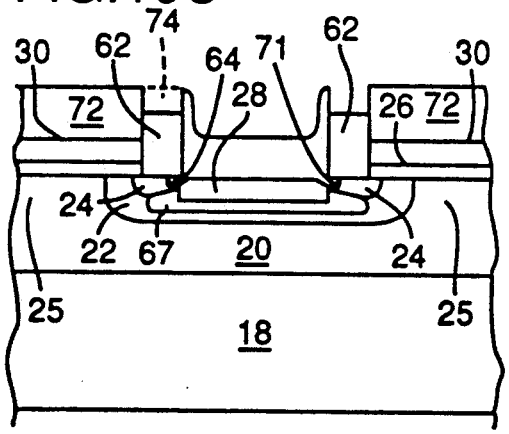

FIG. 16C illustrates the next step, in which artifacts 74 have been etched away. Any metal extending downward along the sidewalls can be removed by continuing the etch. The possibility of a connection between layers 28 and 30 is thus substantially reduced.

Figure 16D:
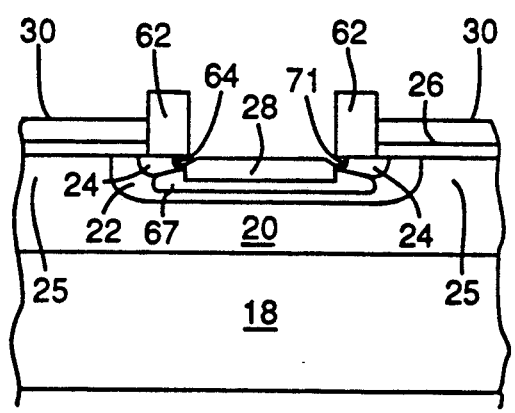

FIG. 16D illustrates the device 10 after layer 72 has been removed. This may be done by any conventional means. If layer 72 is a material that can remain on the device surface, such as glass, removal is not necessary.

It should be obvious now to those skilled in the art that, according to this manner of practicing the invention, a single, independent mask can be used to create, a defined-outline mask-surrogate pattern definer in the structure itself to establish multiple functional features. This capability is illustrated by layers 28 and 30 being non-contacting, which substantially eliminates the possibility of a fatal defect occurring. It is also shown by the manner in which the source and transistor body diffusions are formed, so as to minimize the effects of the parasitic bipolar transistor. Further, it places the conductive source layer electrically close to the channel under the gate so that source resistance is small. Another way to look at this is that, once the independent masking step is performed, all of the other critical steps—the two diffusions, the etching and the metallization—become "self-aligning." This is a key contribution of the invention.

Figure 17:
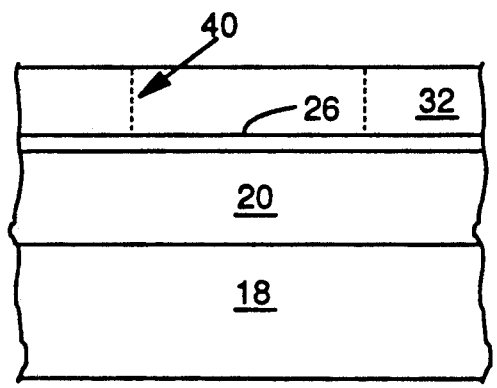
FIG. 17 is a view, similar FIG. 9, which illustrates an alternative manner of practicing the invention.

As mentioned above, there is a variation in the manner of providing the mask-surrogate pattern definer, illustrated generally in FIG. 17. As an aid to understanding what is shown in FIG. 17, this figure should be related to previously-described FIG. 9.

This first alternative manner of practicing the invention is one wherein no independent mask is used. Rather, under computer control, what has been referred to earlier as mask-surrogate pattern-definer 40 is removal-formed directly in layer 32, either by laser-beam impingement, or by ion-beam bombardment. Also, instead of using such a technique to remove material in the formation of a mask-surrogate pattern-definer, the same technique could be employed to deposit such a pattern-definer. Thereafter, all of the other steps described earlier are performed in the same respective manners.

Figure 18:
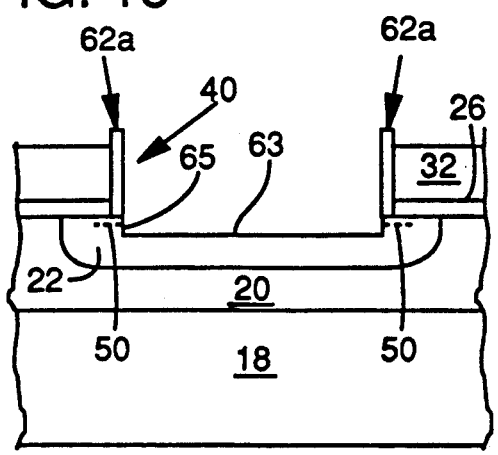
FIGS. 18–20A, inclusive, are views similar to FIGS. 13C, 14 and 15 of a second alternative embodiment.

In another embodiment of the present invention, a departure may be taken at the point of introducing source implant 50 as shown in FIG. 13. Instead of phosphorus, arsenic, a slow diffuser, can be chosen as the dopant and implanted in a conventional implanter at similar energy ranges and doses. In this alternative procedure of realizing the invention, an oxide layer 61a of a thickness between 1,000 to 2,000 angstroms is preferred at the stage shown in FIG. 13A, for reasons which will shortly become apparent. Paralleling the illustration given in FIGS. 13A and 13B for layers 61 and 62, the corresponding anisotropic oxide etch produces a sidewall 62a of 1,000 to 2,000 Angstroms thickness, as shown in FIG. 18.

In the subsequent silicon trenching step, a trench sidewall profile slightly different from that illustrated in FIG. 13C is created. This profile is depicted in FIG. 18 and is produced by the technique described for FIG. 13E. Note that layer 32 is only partially removed. Partial removal can be assured either by depositing layer 32 to a thickness greater than the depth of trench 63 or by depositing the layer in two steps with an intervening thermal oxidation step to provide an oxide layer that limits etching to the portion of layer 32 above this oxide layer (see FIG. 21). Note also that a silicon vertical trenchwall in alignment with 62a oxide sidewall has been shown. This silicon trench profile is identical to that depicted in FIG. 13E. Other profiles such as those of FIGS. 13F and 13J can also be used. The second boron implantation discussed in the first embodiment of the invention in conjunction with FIGS. 13D, 14 to 16 and corresponding implant 66 and diffusion 67 become optional in the current construction.

Figure 18A:
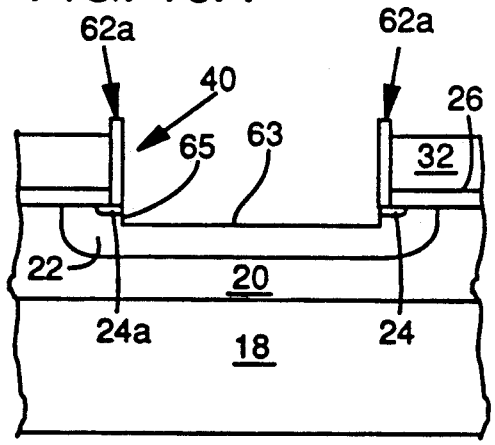
Figure 19:
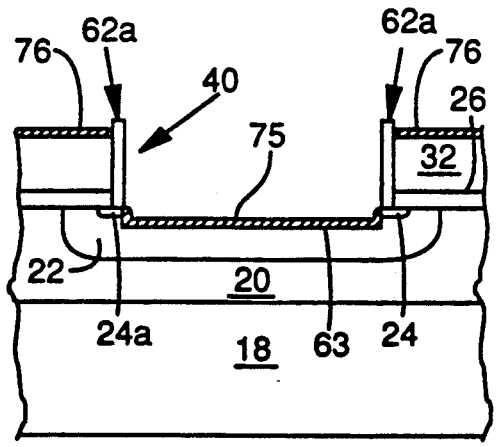

A short implant activation/diffusion cycle is next used to create diffused source region 24a from the arsenic implant 50. A temperature cycle of one to two hours between 1,000° to 1,100° C. should be used to purposely limit lateral diffusion of region 24a under layers 32 and 26 to 0.2 to 0.5 microns. FIG. 18A illustrates the different diffused regions at the end of this cycle.

A metal layer of substantial electrical conductivity, preferably 500 to 1,000 angstroms of tungsten, is deposited by selective CVD deposition to form ohmic contacts 75, 76 in silicon trench 63 and on the polysilicon layer 32. This means of tungsten deposition preferentially metallizes the exposed silicon (new layer 75) and polysilicon (new layer 76) surface but not the oxide sidewalls 62a. Alternatively, contacts 75, 76 can be made by selective silicide formation. The resultant, naturally-isolated multiple functional regions are built upon the same characteristic outline of the pattern definer created in FIG. 9 without the use of any subsequent photomasking.

It can be seen clearly now that the source region 24a of limited lateral diffusion under layers 32 and 26 reduces the base width of the parasitic bipolar transistor structure (regions 24a -22-25 collectively have an N+-P--N- characteristic bipolar arrangement). This enhances the power handling capability of the device in reverse bias operation, accomplishing the same end result that layer 67 provides in the earlier discussions (FIGS. 14 to 16).

To carry the high current out of the silicon, additional metal has to be placed on top of the tungsten layer. This may be done by many methods including plating, evaporation and sputtering. If plating is utilized, such as electrolytic or electroless nickle and/or lead based plating, the new metal layer plates out preferentially on tungsten requiring no metal etching afterwards.

Figure 20:
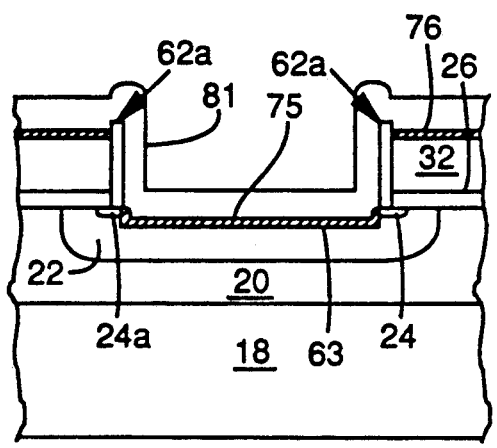
Figure 20A:
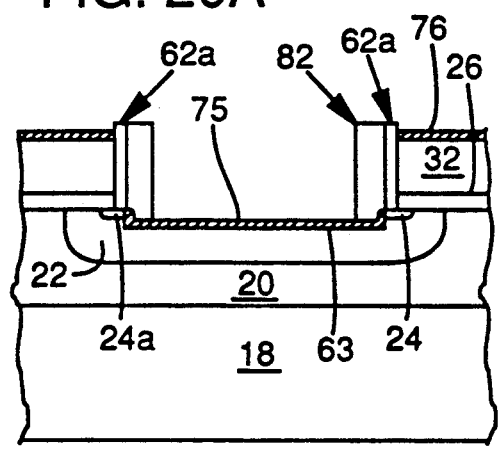

If sputtering or evaporation of aluminum is used, more steps are needed since these deposition techniques are typically not sufficiently selective. Before metal evaporation or sputtering, an insulator layer 8; is deposited over thermal oxide 61a. This layer can be the same as layer 61 used in FIG. 13A. After a second anisotropic oxide etch, a thicker sidewall 82 is created next to the thinner 62a oxide sidewall, as illustrated in FIG. 20A. Metal deposition and patterning can proceed in the same manner as described with reference to FIGS. 16 and 16A-16D.

Figure 21:
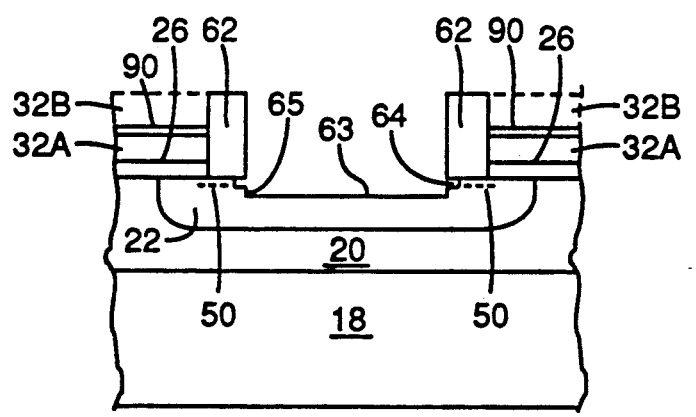
FIG. 21 is a view similar to FIGS. 13C and 18, showing a third embodiment.

Yet another alternative involves a departure at the stages of FIG. 4 and FIGS. 13C or 18, with the result shown in FIG. 21. Instead of depositing a contiguous polysilicon layer 32 (FIG. 4), two successive polysilicon layers 32A, 32B, each of a thickness, e.g., of about 1 μm., are deposited, with an intervening oxidation step. In the etching step (FIGS. 13C or 18) to form trench 63, the oxide layer 90 (e.g., 1000 angstroms) serves as an etch stop to protect the first polysilicon layer 32A. Layer 32A is N-doped to a resistivity conventionally used in polysilicon contacts. Doping can be done before depositing layer 32B or after removing it, such as the step shown in FIG. 14A. Layer 32A can serve as the gate conductive layer without metallization, although deposition of gate metal after removal of oxide layer 90 is preferred for high speed devices.

Accordingly, one should now see how the method proposed by the invention offers a dramatic improvement over the best-known prior art procedures. Mask-dependent, catastrophic errors or defects in a finally produced semiconductor device are obviated. Doping is precisely and effectively controlled to minimize parasitics. Conductive contacts for both the source and gate can be formed in one step and effectively isolated without separate masks. As a significant consequence, the entire usable area of a silicon wafer can be employed with assurance, even in the manufacture of a single, extremely large device, that it will be free from a mask-dependent failure.

In addition to the advantages discussed above which result from employment of the method of the present invention, there are certain others which are worth noting. By minimizing the number of masking steps required, manufacturing time and the number of required manufacturing personnel are reduced. Also, less expensive processing equipment can be used than is now required. Additionally, by shrinking the overall processing time, this reduces the work-in-process inventory, and, of course, such is an important expense consideration. Employing the technique of the invention in the computer-controlled laser/ion beam applications, one can design and generate a semiconductor device easily in an extremely short period of time.

Yet another advantage offered by the invention is that it eliminates the kind of defects which can result from temperature and humidity changes that can occur in the working environment over the time required to complete multiple masking steps. The mask-surrogate pattern-definers which are created, built into the structure as they are, eliminate these possibilities.

Thus, one should see how the important objects of the invention, and the advantages claimed for it, are readily obtained. The teachings of the invention are not limited to a recessed-source power MOSFET. For example, they can be applied advantageously to a recessed-gate process and structure.

Having described and illustrated the principles of my invention in a preferred embodiment and variations thereof, it should be apparent to those skilled in the art that the invention may be modified in arrangement and detail without departing from such principles. I claim all modifications coming within the scope and spirit of the following claims.

I claim:

1. A method, employing no more than one independent mask, of producing an MOS semiconductor device in a substrate structure including a gate oxide layer on an upper surface of a semiconductor substrate, the method comprising: 'forming over the gate oxide layer a dopant protective layer;
   creating a mask-surrogate pattern-definer having a defined outline characteristic in the protective layer;
   exposing a portion of the upper surface of the substrate within a region bounded by the defined outline characteristic;
   performing a first coping step to introduce dopant into said exposed upper surface portion of the substrate so as to form a first region of a first conductivity type, opposite a second conductivity type which is the conductivity type of a second region in said substrate, said first region including said exposed under surface of the substrate and extending to a location under peripheral edges of the protective layer providing the defined outline characteristic, said first region being wholly contained in said second region; and
   after the first doping step, forming a trench in the exposed upper surface of the substrate, the trench being formed to a trench depth greater than a depth of the first region but less than a depth of the second region, and being formed of a width less than a width of the first region such that separated regions of the first conductivity type are provided at sidewalls of the trench, the separated regions constituting source regions of the MOS semiconductor device,
   the trench sidewalls being formed to protrude laterally toward one another within the trench so that a portion of the silicon substrate containing the first region of said first conductivity type is vertically exposed along the trench sidewalls.

2. A method according to claim 1, wherein the protective layer is a dopant-opaque layer.

3. A method according to claim 1, including a further step of depositing a conductive material layer, after forming the trench, having a first portion in the trench in contact with the separated regions and a second portion on the oxide layer, so as to provide electrical contact to the source regions and to form a gate conductive layer of the MOS semiconductor device.

4. A method according to claim 3, wherein the conductive material layer is deposited such that said first portion, when deposited, is separated vertically from said first portion, the first and second portions being deposited at the same time.

5. A method according to claim 1, wherein the second region is formed in said substrate by performing a second doping step, prior to said first doping step, into the exposed upper surface of the substrate, so as to form the second region to extend to a location under the protective layer providing the defined outline characteristic.

6. A method according to claim 5, wherein the second region is formed to extend a distance under the protective layer providing the defined outline characteristic that is 60%-80% of a depth of the second region from the upper surface of the substrate.

7. A method employing no more than one independent mask of producing an MOS semiconductor device in a substrate structure including a gate oxide layer on an upper surface of a semiconductor substrate, said method comprising:

forming over the gate oxide layer a dopant protective layer;

creating a mask-surrogate pattern-definer having a defined outline characteristic in the protective layer;

exposing a portion of the upper surface of the substrate within a boundary determined by the defined outline characteristic;

forming a trench in the exposed upper surface portion of the substrate, the trench having a base and opposite sidewalls in which a lower substrate surface is exposed, the sidewalls being undercut beneath the gate oxide layer;

and simultaneously depositing a gate conductive layer on the oxide layer and a source conductive layer on the lower surface of the substrate, the gate and source conductive layers each conforming to the boundary defined by the defined outline characteristic;

the trench being formed to a trench depth and the source conductive layer to a thickness mutually arranged, spacing the source conductive layer below the oxide layer so as to contact the substrate along the sidewalls of the trench and so that the gate and source conductive layers are electrically separated vertically along said boundary.

8. A method according to claim 7 in which the dopant protective layer is polysilicon.

9. A method according to claim 7 including ion implanting a dopant into the exposed portion of the substrate prior to forming the trench so that the trench divides the doped substrate portion into separate source regions extending along each trench sidewall.

10. A method employing no more than one independent mask of producing an MOS semiconductor device in a substrate structure including a gate oxide layer on an upper surface of a semiconductor substrate, said method comprising:

forming over the gate oxide layer a dopant protective layer;

creating a mark-surrogate pattern-definer having a defined outline characteristic in the protective layer;

exposing a portion of the upper surface of the substrate within a boundary determined by the defined outline characteristic;

forming a trench in the exposed upper surface portion of the substrate, the trench having a base and opposite sidewalls in which a lower substrate surface is exposed and the trench sidewalls are inclined toward one another in a depthwise direction;

and simultaneously depositing a gate conductive layer on the oxide layer and a source conductive layer on the lower surface of the substrate, the gate and source conductive layers each conforming to the boundary defined by the defined outline characteristic;

the trench being formed to a trench depth and the source conductive layer to a thickness mutually arranged, spacing the source conductive layer below the oxide layer so as to contact the substrate along the sidewalls of the trench and so that the gate and source conductive layers are electrically separated vertically along said boundary.

11. A method according to claim 10 in which the sidewalls are undercut beneath the gate oxide layer.

12. A method according to claim 10 in which the dopant protective layer is polysilicon and the step of forming the trench includes reducing the thickness of the polysilicon layer.

13. A method employing no more than one independent mask of producing an MOS semiconductor device in a substrate structure including a gate oxide layer on an upper surface of a semiconductor substrate, said method comprising:

forming over the gate oxide layer a polysilicon dopant protective layer;

creating a mask-surrogate pattern-definer having a defined outline characteristic in the protective layer;

exposing a portion of the upper surface of the substrate within a boundary determined by the defined outline characteristic;

forming a trench in the exposed upper surface portion of the substrate, the trench having a base and opposite sidewalls in which a lower substrate surface is exposed;

reducing the thickness of the polysilicon layer; and simultaneously depositing a gate conductive layer on the oxide layer and a source conductive layer on the lower surface of the substrate, the gate and source conductive layers each conforming to the boundary defined by the defined outline characteristic;

the trench being formed to a trench depth and the source conductive layer to a thickness mutually arranged, spacing the source conductive layer below the oxide layer so as to contact the substrate along the sidewalls of the trench and so that the gate and source conductive layers are electrically separated vertically along said boundary.

14. A method employing no more than one independent mask of producing an MOS semiconductor device in a substrate structure including a gate oxide layer on an upper surface of a semiconductor substrate, said method comprising:

forming over the gate oxide layer a dopant protective layer;

creating a mask-surrogate pattern-definer having a defined outline characteristic in the protective layer;

exposing a portion of the upper surface of the substrate within a boundary determined by the defined outline characteristic;

forming a trench in the exposed upper surface portion of the substrate, the trench having a base and opposite sidewalls in which a lower substrate surface is exposed;

and simultaneously depositing a gate conductive layer on the oxide layer and a source conductive layer on the lower surface of the substrate, the gate and source conductive layers each conforming to the boundary defined by the defined outline characteristic;

the trench being formed to a trench depth and the source conductive layer to a thickness mutually arranged, spacing the source conductive layer below the oxide layer so as to contact the substrate along the sidewalls of the trench and so that the gate and source conductive layers are electrically separated vertically along said boundary, the trench sidewalls being formed to protrude laterally toward one another within the trench so that a portion of the silicon substrate containing a first region of a first conductivity type is vertically exposed along each of the trench sidewalls.

* * * * *